United States Patent [19]

Hasegawa

[11] Patent Number: 4,482,932
[45] Date of Patent: Nov. 13, 1984

[54] KEYBOARD SWITCH

[75] Inventor: Hiroshi Hasegawa, Urawa, Japan

[73] Assignee: Topre Corporation, Tokyo, Japan

[21] Appl. No.: 312,724

[22] Filed: Oct. 19, 1981

[30] Foreign Application Priority Data

Jul. 30, 1981 [JP] Japan .............................. 56-119819
Sep. 9, 1981 [JP] Japan .............................. 56-142118

[51] Int. Cl.³ .............................................. H01G 5/01
[52] U.S. Cl. .................................................... 361/288
[58] Field of Search .............................. 361/288, 290

[56] References Cited

U.S. PATENT DOCUMENTS

| 1,740,159 | 12/1929 | Dublier | 361/290 |
| 3,653,038 | 3/1972 | Webb et al. | 361/288 X |
| 3,693,059 | 9/1972 | Harris | 361/288 |
| 4,047,241 | 9/1977 | Lav | 361/288 |
| 4,288,836 | 9/1981 | Thornburg et al. | 361/288 |

FOREIGN PATENT DOCUMENTS 654954 3/1979 U.S.S.R. .............................. 361/288

OTHER PUBLICATIONS

IBM Technical Disclosure Bulletin vol. 17 No. 11 Apr. 1975 pp. 3377-3378.

Primary Examiner—Donald A. Griffin
Attorney, Agent, or Firm—Oblon, Fisher, Spivak, McClelland & Maier

[57] ABSTRACT

A keyboard switch comprises an insulating substrate, a first electrode laid on the insulating substrate, a second electrode formed of a conical coil spring and facing the first electrode, a dielectric disposed between the first and second electrodes, and a bottom for linearly changing the facing area between the first and second electrodes. The capacitance between the first and second electrodes is changed linearly so that the first and second electrodes are capacitive-coupled for switching operation when the capacitance exceeds a given value.

11 Claims, 21 Drawing Figures

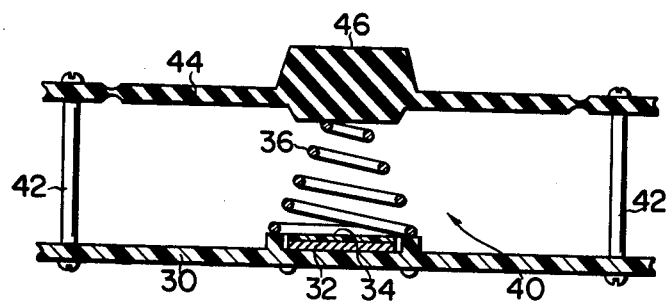
FIG. 6
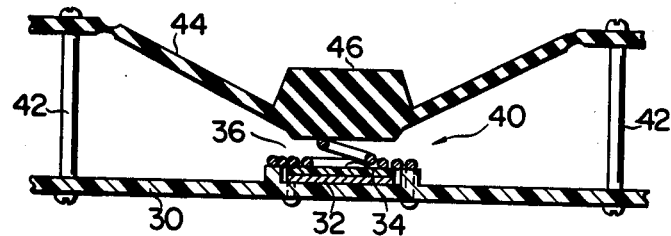
FIG. 7
FIG. 8
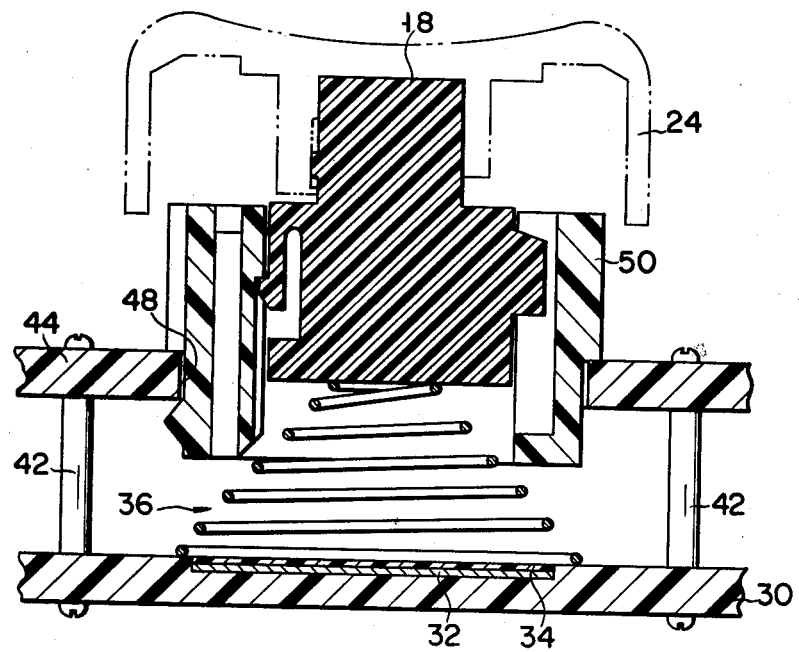

KEYBOARD SWITCH

BACKGROUND OF THE INVENTION

This invention relates to a keyboard switch of a non-contact type used for a keyboard, more specifically to a keyboard switch of a capacitive-coupling type.

In a capacitive-coupling type keyboard switch (hereinafter referred to as capacitive switch), what is called a capacitor is generally provided with fixed and movable electrodes facing each other at a distance, and a dielectric disposed between these electrodes. The movable electrode is fitted with an operating member whereby the distance between the movable and fixed electrodes can be varied.

It is generally known that the capacitance of a capacitor is in inverse proportion to the distance between the electrodes and varies in proportion to the area of the facing portions of the electrodes where the voltage applied between the electrodes is constant. In the aforesaid conventional capacitive switch, the facing area is fixed, and the distance between the electrodes is variable. Accordingly, the capacitance of the capacitive switch varies with the change of the distance between the movable and fixed electrodes, and the capacitive switch performs switching operation according to the variation of the capacitance. Thus, if the capacitance is higher than a given value, the switch is capacitive-coupled to allow a high-frequency component of AC current to flow. If the capacitance is lower than the given value, on the other hand, the switch is not capacitive-coupled, and is turned off.

Hereupon, in the prior art capacitive switch, the relationship between the change of the depth of depression of the operating member and the change of the capacitance, which depends on the change of the distance between the electrodes, may be represented by a hyperbolic curve, as shown in FIG. 1. According to such relationship, as is evident from FIG. 1, the changing rate of the capacitance is low when the depth of depression is narrow, and increases drastically when the depth of depression exceeds a given value. Thus, the setting range for the operating value of capacitance for the performance of switching operation is quite limited, so that it is very difficult optionally to set the operating value.

For example, if the operating value is set within a range where the rate of change of the capacitance responsive to the change of the depth of depression is high, no great hysteresis can be obtained, and it is hard to prevent an erroneous second time depression of the key due to one's finger's shake.

Namely, the depth of depression of the operating member for shifting the capacitive switch from OFF-state to ON-state (ON-operation depth of depression) and the ON-operation capacitance corresponding thereto are generally set greater than the depth of depression of the control member for shifting the capacitive switch from ON-state to OFF-state (OFF-operation depth of depression) and the OFF-operation capacitance corresponding thereto, respectively. The differences between the ON-operation depth of depression and the ON-operation capacitance corresponding thereto, and the OFF-operation depth of depression and the OFF-operation capacitance corresponding thereto constitute the aforesaid hysteresis. The aforesaid operating value is defined by the ON-operation capacitance.

Since the difference between the ON- and OFF-operation capacitances is normally set constant, the difference between the ON- and OFF-operation depths of depression will be reduced if the operating value for the capacitive switch is shifted as required to a range in which the rate of change of the capacitance responsive to the change of the depth of depression is high. Thus, if the hysteresis is small, the capacitive switch will cause the second time depression or repeated ON-OFF operations attributable to delicate shakings of an operator's finger during the depression, for example. As a result, where the capacitive switch is used in an input unit or an electric typewriter, there will be caused double typing or other awkward effects.

SUMMARY OF THE INVENTION

This invention is contrived in consideration of these circumstances, and is intended to provide a keyboard switch capable of securely preventing an erroneous second time depression thereof, with constant hysteresis without changing the performance characteristics even with use of optional operating values.

According to one aspect of the present invention, there is provided a keyboard switch which comprises an insulating body, a first electrode laid on the insulating body, a second electrode facing the first electrode, a dielectric disposed between the first and second electrodes, and means for linearly changing the facing area between the first and second electrodes, whereby the capacitance between the first and second electrodes is changed linearly so that the first and second electrodes are capacitive-coupled for switching operation when the capacitance exceeds a given value.

BRIEF DESCRIPTION OF THE DRAWINGS

FIG. 6 is a sectional view showing a second embodiment of the keyboard switch according to the invention in the first position;

FIG. 7 is a sectional view of the keyboard switch shown in FIG. 6 in the second position;

FIG. 8 is a sectional view showing a third embodiment of the keyboard switch according to the invention in the first position;

DETAILED DESCRIPTION OF THE PREFERRED EMBODIMENTS

Figure 1:
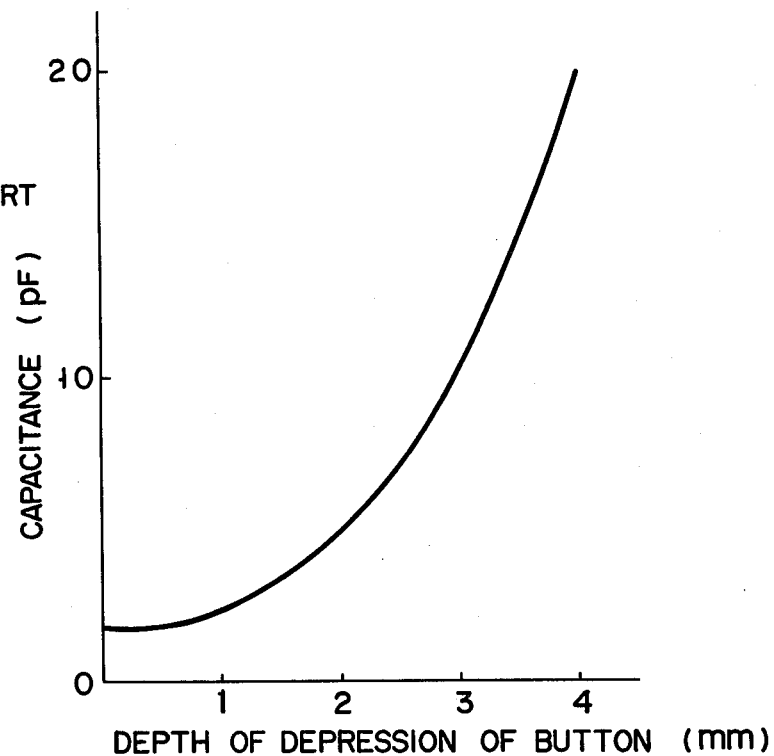
FIG. 1 is a diagram showing the relationship between the capacitance and the depth of depression of the button of a prior art switch.

Referring now to the drawings of FIGS. 2 to 5, there will be described a first embodiment of the keyboard switch according to this invention.

Figure 2:
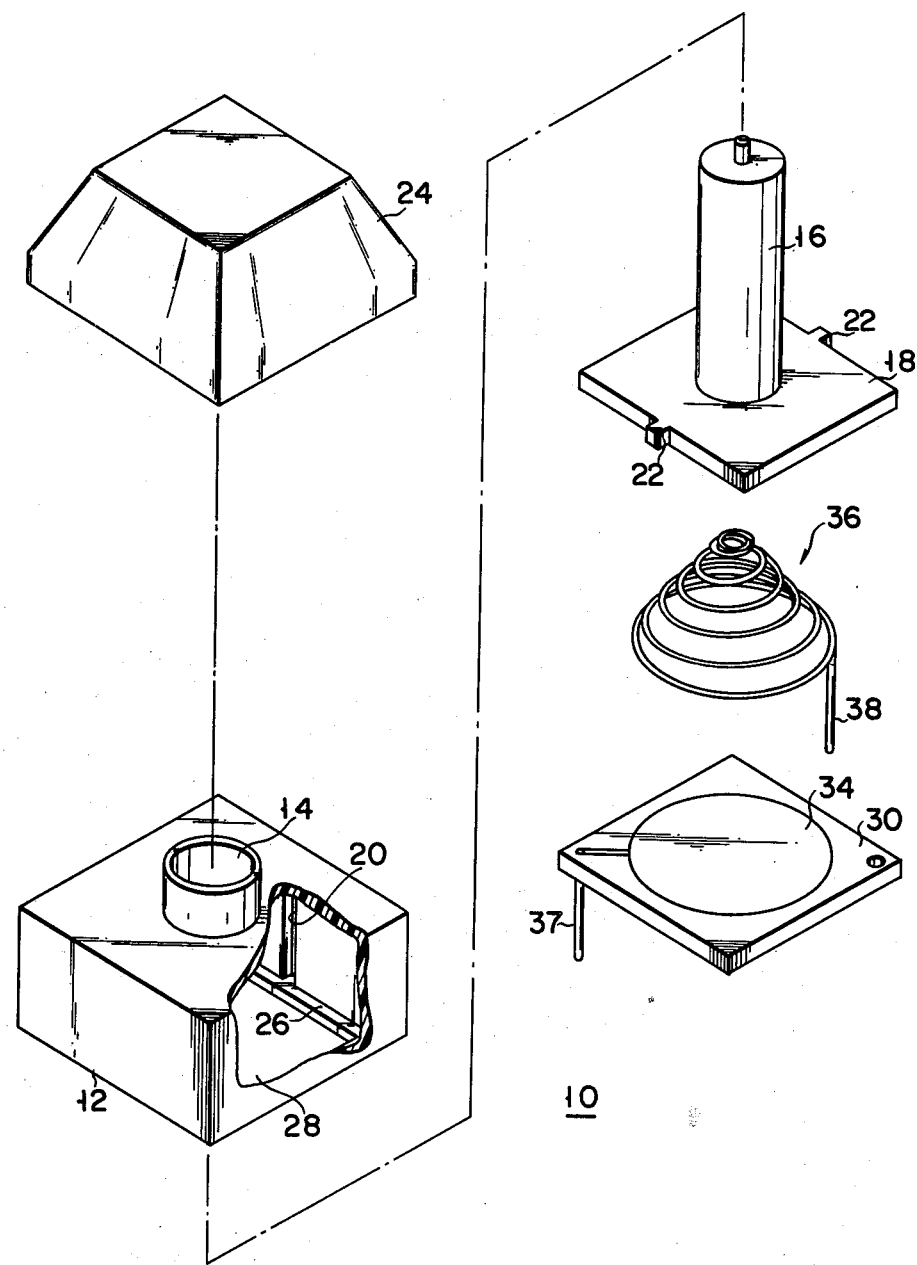
FIG. 2 is a disassembled perspective view showing a first embodiment of a keyboard switch according to this invention.

In FIG. 2, a keyboard switch or capacitive switch 10 is provided with a hollow, rectangular parallelepiped casing 12 formed of synthetic resin. A bore 14 is formed vertically extending through the central portion of the top plate of the casing 12. A stem 16 is inserted in the bore 14 so as to be able to slide vertically. The lower end of the stem 16 is located inside the casing 12, and is fitted integrally with a plate-like plunger 18. The outer perimeter of the plunger 18 is a little shorter than the inner perimeter of the casing 12. Guide grooves 20 are engraved vertically extending on the inner faces of a facing pair of side walls of the casing 12, respectively. A projection 22 is formed at a predetermined portion of a side of the plunger 18 to face each of the guide grooves 20 so as to be fitted in its corresponding guide groove 20. By the engagement between the guide grooves 20 and their corresponding projections 22, the plunger 18 is allowed to reciprocate only vertically without rotating. The upper end of the stem 16 is exposed outside the casing 12, and is removably fitted with a button 24.

Formed in the central portion of a bottom plate 26 of the casing 12 is a rectangular opening 28 with a prescribed size. A base member 30 is attached to the under surface of the bottom plate 26 of the casing 12 so as to block up the opening 28. The base member 30 is formed of an electric insulator, such as synthetic resin. A fixed electrode 32 formed of a good electric conductor is disposed on the base member 30 so as to overspread the opening 28. A dielectric 34 formed of a polyester film overspreads the top surface of the fixed electrode 32. The top surface of the dielectric 34 is substantially flush with the top surface of the bottom plate 26 of the casing 12. A contractible electrode 36 is disposed on the bottom plate 26 of the casing 12.

The contractible electrode 36 is a helical coil spring in the form of a substantially conical shape. The lower and upper ends of the coil spring 36, having the maximum and minimum coil diameters respectively, abut on the top surface of the bottom plate 26 of the casing 12 and the under surface of the plunger 18, respectively. The plunger 18 is biased upward by the urging force of the contractible electrode 36. Formed of a spring material or wire with a circular section, the contractible electrode 36 has electric conductivity. The spring material may be, for example, phosphor bronze or stainless steel. The contractible electrode 36 is so formed as to become spiral when compressed. Namely, when compressed, the contractible electrode 36 becomes flat with its thickness made equal to the diameter of the coil spring wire as the spring material. The maximum coil diameter of the bottom portion of the contractible electrode 36 is greater than the diameter of the dielectric 34. Thus, the lowermost turn of the contractible electrode 36 is not in contact with the dielectric 34.

Figure 3:
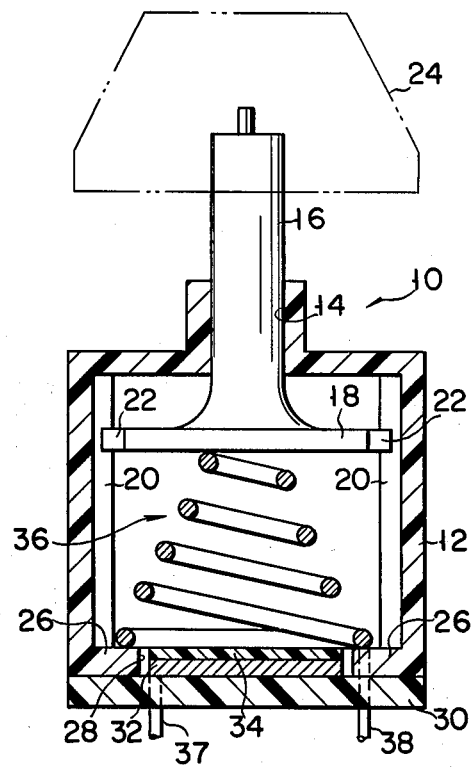
FIG. 3 is a sectional view of the switch shown in FIG. 2 in a first position.
Figure 4:
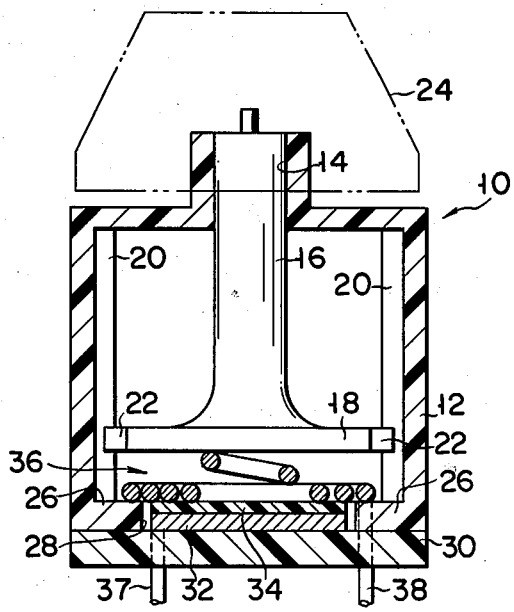
FIG. 4 is a sectional view of the switch shown in FIG. 2 in a second position.

When the button 24 is not subjected to any external force, the plunger 18 is biased upward by the contractible electrode 36, and the button 24 is kept in a first position where it is projected outward over a given distance. In this first position, as shown in FIG. 3, the contractible electrode 36 is in contact only with the top surface of the bottom plate 26 of the casing 12, and is not in contact with the surface of the dielectric 34. When the button 24 is pressed down by a finger, on the other hand, the plunger 18 is biased downward against the urging force of the contractible electrode 36, and the button 24 is brought to a second position where it is slightly projected from the casing 12. In this second position, as shown in FIG. 4, the greater part of the contractible electrode 36 is in contact with the surface of the dielectric 34.

Hereupon, the fixed electrode 32 is connected with one end of a first terminal 37. The other end of the first terminal 37 penetrates the base member 30, and is exposed thereunder. On the other hand, the bottom portion of the contractible electrode 32 is connected with one end of a second terminal 38. The other end of the second terminal 38 penetrates the bottom plate 26 of the casing 12 and the base member 30, and is exposed thereunder. The terminals 37 and 38 are formed of electrically conductive material.

Now there will be described the operation of the capacitive switch 10 of the above-mentioned construction.

An AC voltage at a given level from an AC power source (not shown) is applied between the fixed and contractible electrodes 32 and 36 via the first and second terminals 37 and 38. When the button 24 is in the first position shown in FIG. 3 where it is not depressed, no part of the contractible electrode 36 is in contact with the surface of the dielectric 34. Further, the fixed electrode 32 and the turn portions of the contractible electrode 36 facing the fixed electrode 32 with the dielectric 34 between them are kept at given distances. Therefore, the capacitance defined between the electrodes 32 and 36 is as low as 1 (pF), for example.

Figure 5:
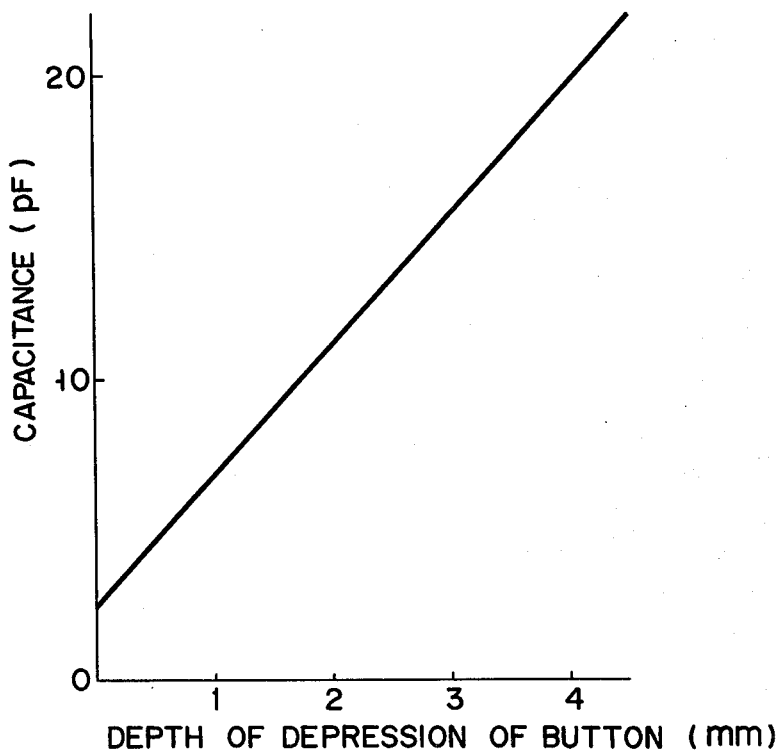
FIG. 5 is a diagram showing the relationship between the capacitance and the depth of depression of the button of the switch according to the first embodiment.

When the button 24 is depressed from the first position by a finger, the plunger 22 is pushed down against the urging force of the contractible electrode 36. In response to the depression of the plunger 22, the contractible electrode 36 comes into contact with the surface of the dielectric 34, the lower turns going ahead of the upper ones. This is done because a turn portion with a greater coil diameter is subjected to greater twisting moment and hence to heavier deformation. In a no-load state, the conical spring constituting the contractible electrode 36 is reduced in diameter in proportion to its height. Accordingly, the area of the contractible electrode 36 in contact with the surface of the dielectric 34 increases substantially in proportion to the increase of the depth of depression of the button 24. Thereupon, as is generally known, the capacitance C of a capacitor is defined as follows:

$$C = \epsilon(S/d)$$

where d is the distance between the electrodes 32 and 36, S is the area of the facing portions of the electrodes 32 and 36, and $\epsilon$ is the dielectric constant of the dielectric 34. Since $\epsilon$ is regarded as constant and the variation of d is substantially negligible, the capacitance obtained between the electrodes 32 and 36 depends on S. Namely, this capacitance varies substantially in proportion to the depth of depression of the button 24, as shown in FIG. 5.

When the button 24 is in the second position as shown in FIG. 4 where the contractible electrode 36 is crushed substantially flat by the plunger 18, the capacitance obtained between the electrodes 32 and 36 is 22 (pF), for example.

Hereupon, the set value of the capacitance for the switching operation is adjusted to 12 (pF) so that the switch may be turned on with half the full depth of depression of the button 24. As for the capacitance value for OFF-operation, it is set to 8 (pF) which is 4 (pF) lower than the set value for the ON-operation. Thus, the capacitive switch 10 is turned on when the button 24 is pushed in from the position shown in FIG. 3 by a finger to reach half the full depth of depression. Namely, the capacitive switch 10 is capacitive-coupled to allow high-frequency current to flow. This conducting state may be maintained even after the button 24 is further depressed to increase the capacitance. When the finger is then removed from the button 24, the plunger 18 is pushed up by the urging force of the contractible electrode 36. The capacitive switch 10 is turned off when the plunger 18 reaches a position where the depth of depression of the button 24 is a little narrower than half the full depth. Thus, the capacitive switch 10 is released from the capacitive coupling to be insulated.

In the aforementioned capacitive switch 10, the contractible electrode 36 is formed of the conical coil spring, and the facing area between the electrodes 32 and 36 is changed by compressing the coil spring by means of the plunger. Hereupon, the facing area changes substantially in direct proportion to the depth of depression of the plunger 18 or the button 24. Accordingly, the characteristic curve for the capacitance varying according to such facing area is substantially linear, as shown in FIG. 5. Thus, the set value for the ON-operation can take any suitable or optional value.

As a result, even if the ON-operation value is varied optionally with a fixed difference between the ON- and OFF-operation values for hysteresis, the depth of depression corresponding to the difference between the ON- and OFF-operation will never change, and constant hysteresis can be maintained. Thus, it is not feared that the depth of depression of the button between the positions for the OFF- and ON-operations is reduced to cause an erroneous second time depression of the button by setting the operating value within a range where the rate of change of the capacitance responsive to the change of the depth of depression is high, as in the case of the prior art switch.

Since the contractible electrode 36 is formed of a conical coil spring, moreover, the button 24, when released from the depression, is returned to the first position by the urging force of the contractible electrode 36. Accordingly, there is no need of a return spring for the operating member. Thus, the number of components is reduced, and the construction is simplified to ensure low manufacturing cost.

A plurality of such capacitive switches or keyboard switches 10 may be arranged on a panel to constitute a keyboard.

This invention is not limited to the above-mentioned first embodiment, and various changes and modifications may be effected therein by one skilled in the art without departing from the scope or spirit of the invention. In the description of various other embodiments to follow, like reference numerals refer to like portions.

FIGS. 6 and 7 show a second embodiment of the keyboard switch according to the invention. In this second embodiment, no casing is used. Namely, a capacitive switch 40 of the second embodiment comprises a printed substrate 30 as a base member, a fixed electrode 32 fixed directly on the surface of the printed substrate 30, a dielectric 34 attached to the surface of the fixed electrode 32, an elastic plate 44 as a cover member disposed over and in parallel with the printed substrate 30 with a plurality of spacers 42 between them, a button 46 mounted on that portion of the elastic plate 44 right over the fixed electrode 32, and a contractible electrode 36 formed of a conical coil spring and disposed between the button 46 and the dielectric 34. The button 46 may be formed integrally by thickening part of the elastic plate 44.

When subjected to no external force, the button 46 is maintained in the first position (FIG. 6) as mentioned in connection with the first embodiment by the elasticity of the elastic plate 44 and the contractible electrode 36. When the button 46 is pressed down against such elasticity to be brought to the second position as shown in FIG. 7, the capacitive switch 40 is capacitive-coupled to be turned on. Thus, according to the second embodiment, the same effect of the first embodiment may be obtained without using the casing, and the trouble of manufacturing the keyboard can greatly be reduced. Moreover, the switch 40 can be thinned.

Figure 9:
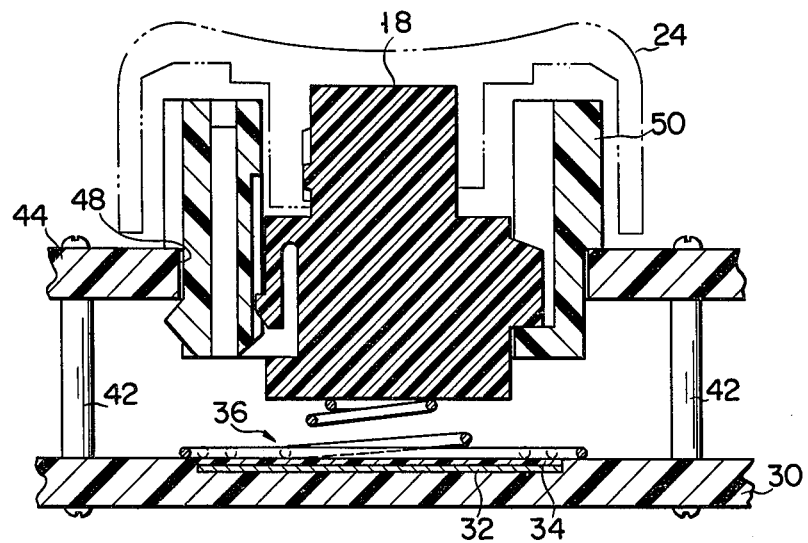
FIG. 9 is a sectional view of the keyboard switch shown in FIG. 8 in the second position.
Figure 10:
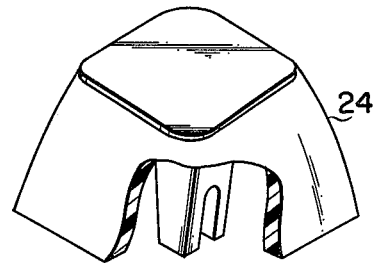
FIG. 10 is a partially broken away, perspective view showing a fourth embodiment of the keyboard switch according to the invention.
Figure 10:
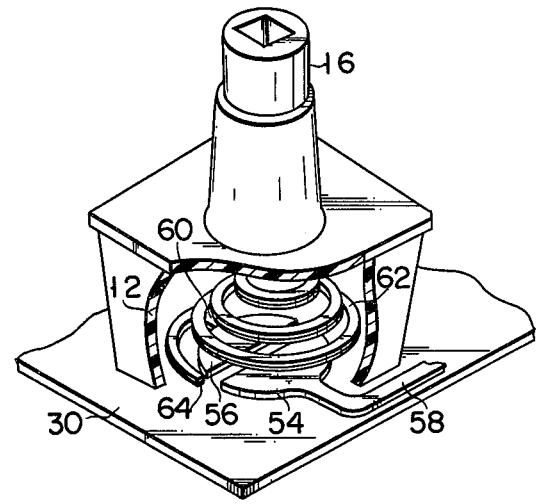

FIGS. 8 and 9 show a third embodiment of the keyboard switch according to the invention. In this third embodiment, like in the second embodiment, no casing is used. The third embodiment differs from the second embodiment in that the cover member is formed not of elastic material but of rigid synthetic resin. In the third embodiment, a bore 48 is formed in that portion of a cover member 44 which is located right over a fixed electrode 32, and a guide member 50 formed of a hollow pillar-like structure with a rectangular section is fixedly inserted in the bore 48. A plunger 18 is held in the guide member 50 so as to be able to move vertically between the first position shown in FIG. 8 and the second position shown in FIG. 9. A contractible electrode 36 formed of a conical coil spring is disposed between the under surface of the plunger 18 and the dielectric 34.

Thus, according to the third embodiment, the same effect of the second embodiment may be obtained.

In the second and third embodiments, the respective terminals of the fixed and contractible electrodes 32 and 36 may be led out over or under the printed substrate 30.

FIGS. 10 to 13 show a fourth embodiment according to the invention. In this fourth embodiment, a capacitive switch 52 includes a pair of fixed electrodes 54 and 56 fixed on a base member 30 so as to face each other at a given distance. Respective terminals 58 and 60 of the fixed electrodes 54 and 56 are led out on the base member 30. The fixed electrodes 54 and 56 are each formed of a substantially semicircular sheet, with their chord portions facing each other. An auxiliary electrode 62 is put on a region defined by the two fixed electrodes 54 and 56. Having the same construction as the contractible electrode 36 described in connection with the first embodiment, the auxiliary electrode 62 is formed of a conical coil spring whose element wire has a rectangular section. As shown in detail in FIG. 13, a dielectric 64 overspreads the under side of the element wire forming the coil spring of the auxiliary electrode 62, that is, the surface to face the fixed electrodes 54 and 56.

Figure 11:
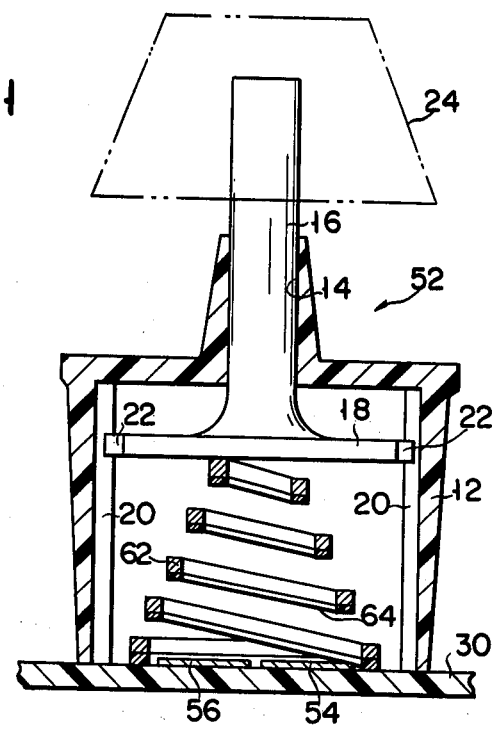
FIG. 11 is a sectional view of the keyboard switch shown in FIG. 10 in the first position.
Figure 12:
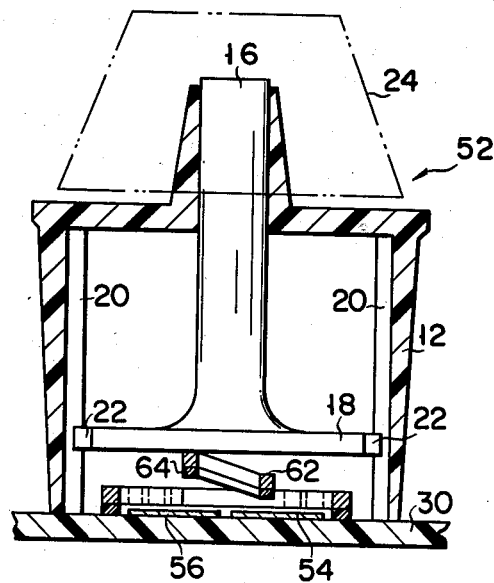
FIG. 12 is a sectional view of the keyboard switch shown in FIG. 10 in the second position.
Figure 13:
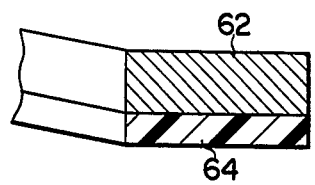
FIG. 13 is an enlarged sectional view showing part of an auxiliary electrode used in the keyboard switch shown in FIG. 10.

In the fourth embodiment constructed in this manner, the facing area between the two fixed electrodes 54 and 56 facing each other with the dielectric 64 between them in the first position as shown in FIG. 11 is narrow. Therefore, the capacitance obtained between these electrodes 54 and 56 is low. When a button 24 is depressed from the first position by a finger, the auxiliary electrode 62 comes into contact with the fixed electrodes 54 and 56 by means of the dielectric 64 according to the depth of depression of the button 24, with the lowermost turn touching the fixed electrodes 54 and 56 first. Accordingly, the aforesaid facing area changes substantially in proportion to the depth of depression of the button 24. Namely, the capacitance obtained between the electrodes 54 and 56 changes in like manner. The maximum capacitance can be obtained in the second position as shown in FIG. 12. Thus, the same switching operation as in the first embodiment may be effected. Since the contact portions between the dielectric 64 and the fixed electrodes 54 and 56 are flat, the contact area is much wider than the contact areas obtained in the aforementioned first to third embodiments. Thus, the difference between the capacitances obtained when the button is in the first and second positions is increased to ensure wider setting range for the operating values and greater hysteresis.

Figure 14:
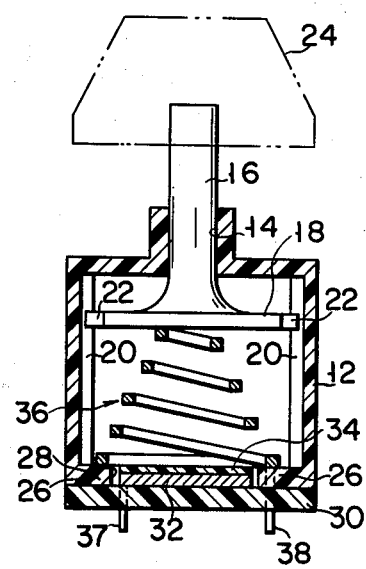
FIG. 14 is a sectional view showing a first modification of the first embodiment.
Figure 15:
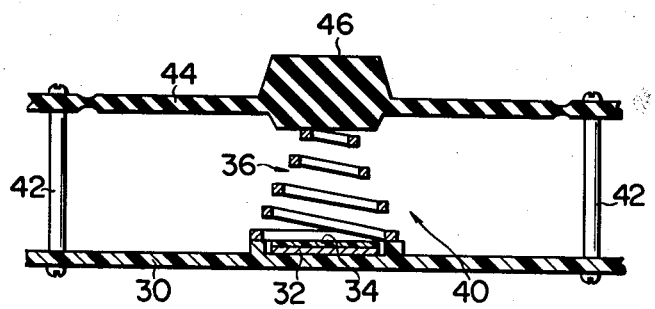
FIG. 15 is a sectional view showing a modification of the second embodiment.
Figure 16:
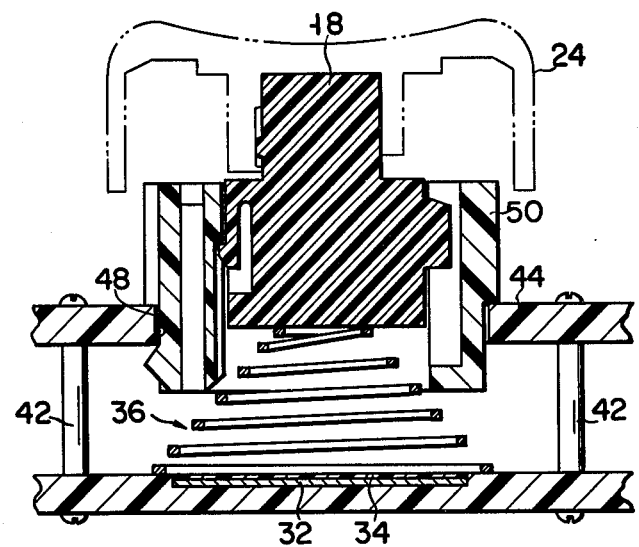
FIG. 16 is a sectional view showing a modification of the third embodiment.

In the above-mentioned first to third embodiments, the element wire of the conical coil spring used as the contractible electrode has been explained as having a circular section. This invention is not, however, limited to such precise configuration, and a conical coil spring formed of a rectangular section wire may be used for the contractible electrode 36, as shown in FIGS. 14 to 16 as respective modifications of the first to third embodiments. Hereupon, the contact area may greatly be increased to ensure the same effect of the fourth embodiment by setting the conical coil spring so that the bottom side of the element wire may face the fixed electrodes 54 and 56 in parallel thereto.

Figure 17:
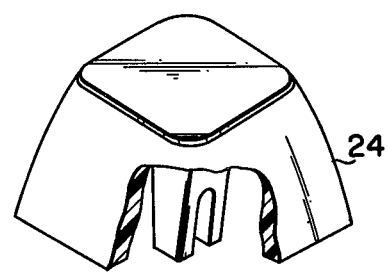
FIG. 17 is a perspective view showing a first modification of the fourth embodiment.
Figure 17:
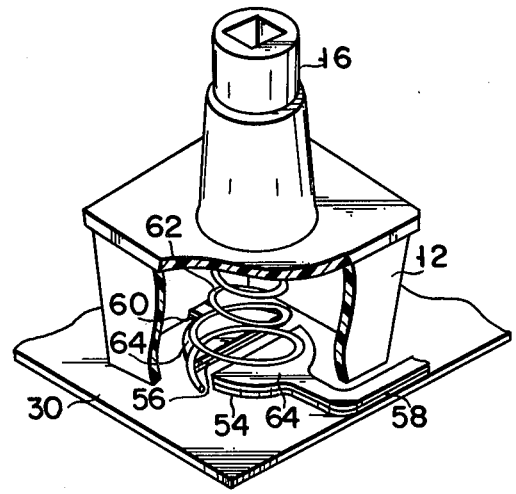
Figure 18:
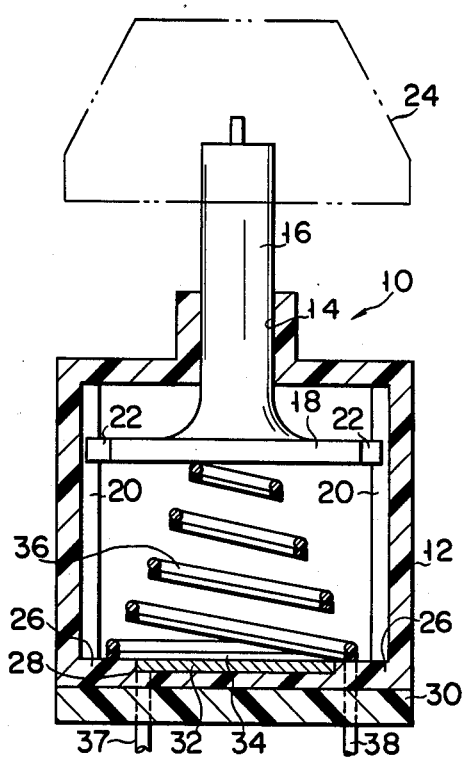
FIG. 18 is a sectional view showing a second modification of the first embodiment.
Figure 19:
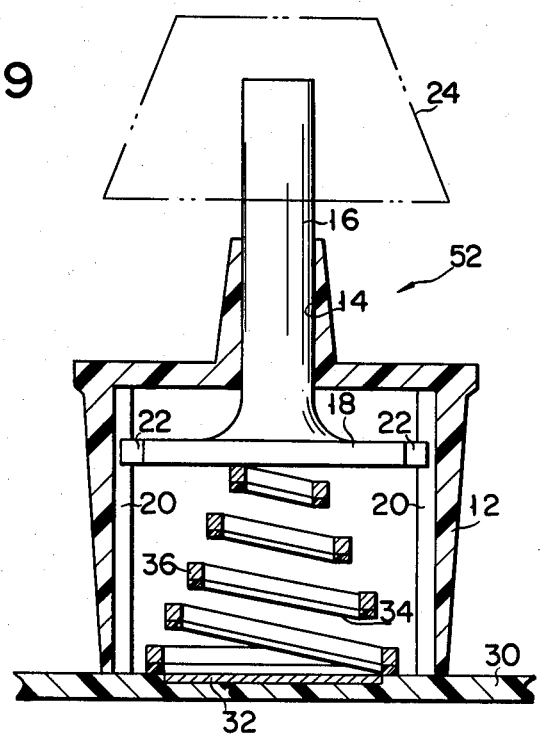
FIG. 19 is a sectional view showing a third modification of the first embodiment.
Figure 20:
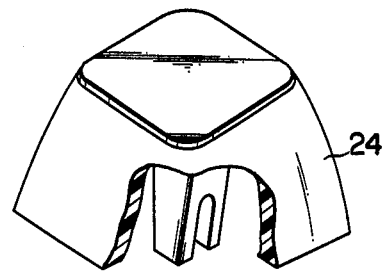
FIG. 20 is a perspective view showing a second modification of the fourth embodiment.
Figure 21:
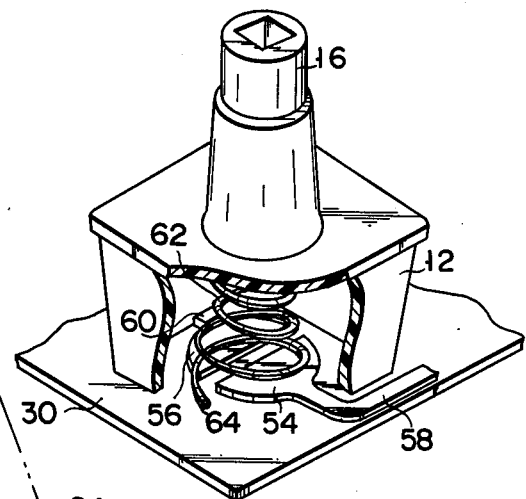
FIG. 21 is a sectional view showing a third modification of the fourth embodiment.
Figure 21:
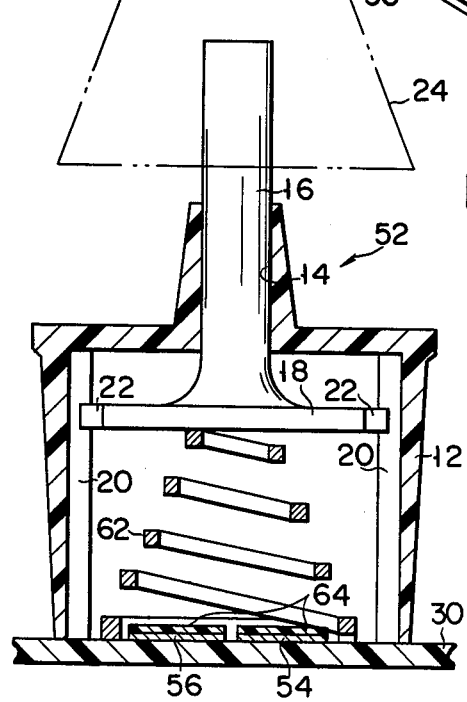

Further, as shown in FIG. 17 as a first modification of the fourth embodiment, the element wire of the coil spring 62 may have a circular section, and dielectric 64 may be attached to the upper sides of the two fixed electrodes 54 and 56. Still further, as shown in FIG. 18 as a second modification of the first embodiment, the element wire of the coil spring 36 may have a circular section, and dielectric 34 may be attached to the bottom surface of the coil spring 36. As shown in FIG. 19 as a third modification of the first embodiment, the element wire of the coil spring 36 may have a rectangular section, and dielectric 34 may be attached to the bottom surface of the coil spring 36. As shown in FIG. 20 as a second modification of the fourth embodiment, the element wire of the coil spring 62 may have a circular section and dielectric 64 may be attached to the under surface of the coil spring 62. And as shown in FIG. 21 as a third modification of the fourth embodiment, the element wire of the coil spring 62 may have a rectangular section, and dielectric 64 may be attached to the upper sides of the two fixed electrodes 54 and 56.

What is claimed is:

1. A keyboard switch comprising:
    an insulating substrate;
    a first electrode fixed to one surface of the insulating substrate;
    a second electrode fixed to said one surface of the insulating substrate and positioned apart from the first electrode;
    a dielectric formed on the first and second electrodes;
    an auxiliary electrode formed on a conical coil spring having a large diameter end portion and a small diameter end portion, said large diameter end portion in contact with the dielectric, and the conical coil spring being circular in cross-section, said large diameter end portion thereof being greater in size than a combination of said first and second electrodes thereby to bridge said first and second electrodes; and
    a button mounted on the small diameter end portion of said auxiliary electrode and capable of moving toward said insulating substrate.

2. The keyboard switch according to claim 1, wherein said auxiliary electrode becomes flat to overspread said first and second electrodes with said dielectric interposed therebetween when pressed by said button.

3. The keyboard switch according to claim 2, wherein said auxiliary electrode has one end portion greater than a combination of said first and second electrodes in size.

4. The keyboard switch according to claim 1, 2 or 3, wherein said auxiliary electrode has a circular section.

5. The keyboard switch according to claim 4, wherein said dielectric is attached to the surface of said auxiliary electrode.

6. The keyboard switch according to claim 4, wherein said dielectric is attached to the surfaces of said first and second electrodes.

7. The keyboard switch according to claim 1, 2 or 3, wherein said auxiliary electrode has a rectangular section, with its bottom side facing said insulating substrate.

8. The keyboard switch according to claim 7, wherein said dielectric is attached to the surface of said auxiliary electrode.

9. The keyboard switch according to claim 7, wherein said dielectric is attached to the surfaces of said first and second electrodes.

10. A keyboard switch comprising:
    an insulating substrate;
    a first electrode fixed to one surface of the insulating substrate;
    a second electrode fixed to said one surface of the insulating substrate and positioned apart from the first electrode;
    a dielectric formed on the first and second electrodes;
    an auxiliary electrode formed on a conical coil spring having a large diameter end portion and a small diameter end portion, said large diameter end portion in contact with the dielectric; and
    a button mounted on the small diameter end portion of said auxiliary electrode and capable of moving toward said insulating substrate;
    wherein said auxiliary electrode has a circular cross-section and said dielectric is attached to the surface of said auxiliary electrode.

11. A keyboard switch comprising:

an insulating substrate;

a first electrode fixed to one surface of the insulating substrate;

a second electrode fixed to said one surface of the insulating substrate and positioned apart from the first electrode;

a dielectric formed on the first and second electrodes;

an auxiliary electrode formed on a conical coil spring having a large diameter end portion and a small diameter end portion, said large diameter end portion in contact with the dielectric; and a button mounted on the small diameter end portion of said auxiliary electrode and capable of moving toward said insulating substrate;

wherein said auxiliary electrode has a rectangular cross-section, with its bottom side facing said insulating substrate, and said dielectric is attached to the surface of said auxiliary electrode.

* * * * *